United States Patent
Roy et al.

(10) Patent No.: US 8,674,283 B2
(45) Date of Patent: Mar. 18, 2014

(54) IMAGE SENSOR WITH REDUCED OPTICAL CROSSTALK

(75) Inventors: Francois Roy, Seyssins (FR); Flavien Hirigoyen, Grenoble (FR); Julien Michelot, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 294 days.

(21) Appl. No.: 13/333,885

(22) Filed: Dec. 21, 2011

(65) Prior Publication Data

US 2012/0153128 A1   Jun. 21, 2012

(30) Foreign Application Priority Data

Dec. 21, 2010   (FR) ..................................... 10 05005

(51) Int. Cl.
*H01L 27/146* (2006.01)
(52) U.S. Cl.
USPC ................. 250/208.1; 250/214.1; 257/432; 257/446; 257/520
(58) Field of Classification Search
USPC ............ 250/208.1, 214.1; 257/432, 445, 446, 257/461, 499, 510, 520
See application file for complete search history.

(56) References Cited

U.S. PATENT DOCUMENTS

| 7,187,017 | B2 | 3/2007 | Sawase et al. |
| 7,279,770 | B2 | 10/2007 | Mouli |
| 2005/0184353 | A1 | 8/2005 | Mouli ........................... 257/446 |
| 2006/0043437 | A1 | 3/2006 | Mouli ........................... 257/291 |
| 2007/0020795 | A1 | 1/2007 | Mori et al. ..................... 438/57 |
| 2007/0145516 | A1 | 6/2007 | Lee ................................. 257/499 |
| 2007/0194356 | A1 | 8/2007 | Moon et al. .................. 257/291 |
| 2007/0200148 | A1 | 8/2007 | Hirata et al. ................. 257/222 |
| 2007/0262241 | A1 * | 11/2007 | Inoue et al. ................ 250/208.1 |
| 2008/0099871 | A1 | 5/2008 | Bui et al. ...................... 257/461 |

FOREIGN PATENT DOCUMENTS

| JP | 2005-123449 A | 5/2005 |
| JP | 2008-10544 A | 1/2008 |
| KR | 10-2010-0025107 A | 3/2010 |

OTHER PUBLICATIONS

U.S. Appl. No. 13/333,884 filed on Dec. 21, 2011.

* cited by examiner

*Primary Examiner* — Kevin Pyo
(74) *Attorney, Agent, or Firm* — Seed IP Law Group PLLC

(57) ABSTRACT

A method of fabricating an image sensor includes the steps of: forming at least two photosites in a semiconductor substrate; forming a trench between the photosites; forming a thin liner on at least the sidewalls of the trench; depositing a conductive material having a first refractive index in the trench; and forming a region surrounded by the conductive material and having a second refractive index lower than the first index of refraction within the conductive material in the trench.

23 Claims, 3 Drawing Sheets

IMAGE SENSOR WITH REDUCED OPTICAL CROSSTALK

BACKGROUND

1. Technical Field

The present disclosure relates to an image sensor including at least two photosites separated by an isolation region, and to a method for forming the isolation region between the photosites.

2. Description of the Related Art

Camera modules typically include a lens, an infrared filter, and an image sensor in the form of a semiconductor chip comprising several photosites, one or more photosites corresponding to a pixel of a captured image. The photosites are generally arranged in a matrix and may include photodiodes, photogates, or photoconductors, etc. In general, above the photosites are distributed a mosaic of microlenses to converge incident light rays on the photosites and a mosaic of colored filters to filter the light. Layers of dielectric materials are also generally present above the photosites, and serve to insulate conductive lines interconnecting the sites, and act as passivation layers against humidity and impurities. Channels are formed in the dielectric layers through which the light rays must pass to reach the photosites.

An image sensor uses the "photoelectric effect" to transform light information into an electrical signal. A photon of an incident light ray penetrates into the material of the photosite, and if the energy of the photon is equal to or greater than the material's energy bandgap, an "electron-hole pair" is generated. The number of electrons per photosite may be measured and used to supply light information for the image, and the number of electrons read per number of incident photons is known as the quantum efficiency. Photons with short wavelengths have a shallow penetration depth, such as 0.4 µm for wavelengths of 450 nm (blue light), and photons with long wavelengths have a deeper penetration depth, such as 2.4 µm for wavelengths of 600 nm (red light). As adjacent photosites correspond to differently-filtered light (for example red, green, or blue) as well as to different image pixels, their information should be independently provided. The angular response of a pixel is the light intensity measured vs.

the angle of the incident light. For example, for a "field of view" from −45° to 45°, with 0° being perpendicular to the surface of the photosite, the intensity is generally the highest at 0°, and decreases towards the edges of the field, in the shape of a bell curve. Ideally, the light intensity would be the same for the entire field of view, but depending upon its incident angle, a light ray intended for one photosite may cross to another photosite, causing optical crosstalk. The sensitivity of an image sensor thus depends on quantum efficiency and the amount of crosstalk that occurs.

U.S. Pat. No. 7,279,770 discloses an image sensor comprising a deep trench isolation (DTI) of at least 4 µm between adjacent photosites. The depth of the trench therefore prevents deeply-generated electrons from passing under the isolation region from one photosite to another. Furthermore, the trench is filled with a conductive material such as polysilicon, after having been covered by a liner, such as a dielectric layer. The conductive material may be more easily deposited into deep trenches as opposed to conventional isolation materials such as oxide which may cause undesirable voids or air gaps. The liner prevents generated electrons from passing through the trench from one photosite to another, which is known as electrical crosstalk.

FIG. 1 is a cross-sectional view of a part of a conventional image sensor IS1 according to the teaching of the above-mentioned patent. The image sensor IS1 includes, from bottom to top, a substrate 10 comprising three photosites S1, S2, S3; an insulator layer 70; a stack 80 of dielectric layers 80-1 to 80-N, each layer comprising conductive lines 90-1 to 90-N to extract electrical information from and power the photosites; colored filters F1, F2, F3; and microlenses L1, L2, L3. Isolation regions 11, 12 extend between sites S1, S2 and S2, S3 respectively, and each includes a deep trench made in the substrate 10 and having its bottom and sidewalls covered by a thin liner 20, and filled with a conductive material 30.

FIG. 1 schematically shows three incident light rays R1, R2, R3. Light ray R1 passes through filter F1, penetrates into photosite S1, and generates an electron E1 read by photosite S1. Light ray R2 passes through filter F2 and has an angle and a penetration depth such that it enters the isolation region I1 instead of a photosite. The photons of ray R2 are absorbed in the conductive material 30 of the isolation region I1, and a trapped electron E2 is generated. The quantum efficiency is thus decreased as the photon of ray R2 is not captured by a photosite. Light ray R3 passes through filter F3, but has an angle such that instead of being absorbed in the corresponding photosite S3, it crosses the isolation region I2 and penetrates into the adjacent photosite S2, where it is absorbed and generates an electron E3. Electron E3 is thus incorrectly read by photosite S2 instead of by photosite S3, and optical crosstalk occurs.

BRIEF SUMMARY

An embodiment relates to a method for fabricating an image sensor, comprising the steps of: forming at least two photosites in a semiconductor substrate; forming a trench between the photosites; forming a thin dielectric liner on at least the sidewalls of the trench; depositing a conductive material with a first refractive index in the trench; and forming a region surrounded by the conductive material and having a second refractive index lower than the first index of refraction within the conductive material in the trench.

According to one embodiment, the step of forming the region with the second refractive index includes a step of depositing the conductive material on the sidewalls of the trench until the region is enclosed in the conductive material.

According to one embodiment, the step of depositing the conductive material includes enclosing a gas in the region with the second refractive index.

According to one embodiment, the step of forming the region with the second refractive index comprises a non-conformal deposition process of the conductive material.

According to one embodiment, the step of depositing the conductive material in the trench comprises depositing the conductive material so that the thickness of the conductive material on the sidewalls of the trench is greater at the upper portion of the trench, and thinner at the lower portion of the trench.

According to one embodiment, the step of depositing the conductive material is a plasma-enhanced chemical vapor deposition process.

According to one embodiment, the method further comprises a step of forming a contact allowing a voltage to be applied to the conductive material.

An embodiment relates to an image sensor comprising: a semiconductor substrate; at least two photosites in the substrate; an isolation region formed in a trench between the photosites, the isolation region comprising a conductive material with a first refractive index, the trench being covered on at least the sidewalls by a thin dielectric liner; and the conductive material at least partially surrounds a region with a second refractive index lower than the first index of refraction.

According to one embodiment, the region with the second refractive index is enclosed by the conductive material.

According to one embodiment, the region with the second refractive index comprises a gas.

According to one embodiment, the conductive material on the sidewalls of the trench has a greater thickness at one end of the trench than at another end of the trench.

According to one embodiment, the first refractive index is greater than 3, and the second refractive index is less than 1.5.

According to one embodiment, the image sensor further comprises a contact to the conductive material to apply a voltage to the conductive material.

According to one embodiment, the image sensor further comprises a filter and a microlens arranged above each photosite.

An embodiment relates to a device comprising: an image sensor as disclosed above and electrical means coupled to the image sensor.

In an embodiment, a method comprises: fabricating an image sensor by, forming two photosites in a semiconductor substrate; forming a trench between the photosites; forming a dielectric liner on one or more sidewalls of the trench; and positioning a conductive material having a first refractive index on the dielectric liner in the trench, the conductive material enclosing a region having a second refractive index lower than the first refraction index. In an embodiment, the positioning the conductive material in the trench comprises depositing the conductive material on the dielectric liner of the trench until the region is enclosed in the conductive material. In an embodiment, the positioning the conductive material in the trench comprises enclosing a gas having the second refractive index. In an embodiment, the positioning the conductive material in the trench comprises using a non-conformal deposition process of the conductive material. In an embodiment, the positioning the conductive material in the trench comprises depositing the conductive material so that a thickness of the conductive material on the dielectric liner is greater at a first portion of the trench, and thinner at a second portion of the trench. In an embodiment, the positioning the conductive material comprises depositing the conductive material using a plasma-enhanced chemical vapor deposition process. In an embodiment, the method further comprises a step of forming a contact electrically coupled to the conductive material. In an embodiment, forming the trench comprises forming a trench extending through the semiconductor substrate.

In an embodiment, an image sensor comprises: a semiconductor substrate; at least two photosites positioned in the substrate; and an isolation region positioned between the photosites, the isolation region having: a trench having one or more sidewalls; a dielectric liner positioned on the one or more sidewalls of the trench; a conductive region having a first refractive index and positioned on the liner; and a region having a second refractive index lower than the first refractive index and enclosed by the conductive region. In an embodiment, the region having the second refractive index comprises a gas. In an embodiment, the conductive material positioned on the one or more sidewalls of the trench has a greater thickness at one end of the trench than at another end of the trench. In an embodiment, the first refractive index is greater than 3, and the second refractive index is less than 1.5. In an embodiment, the image sensor further comprises a contact configured to apply a biasing voltage to the conductive material. In an embodiment, the image sensor further comprises a plurality of filters and a plurality of microlens coupled to respective photosites. In an embodiment, the trench extends through the semiconductor substrate.

In an embodiment, a device comprises: a processor; and an image sensor, the image sensor including: a semiconductor substrate; at least two photosites positioned in the substrate; and an isolation region positioned between the photosites, the isolation region having: a trench having one or more sidewalls; a dielectric liner positioned on the one or more sidewalls of the trench; a conductive region having a first refractive index and positioned on the dielectric liner; and a region having a second refractive index lower than the first refractive index and enclosed by the conductive region. In an embodiment, the region having the second refractive index comprises a gas. In an embodiment, the conductive material positioned on the one or more sidewalls of the trench has a greater thickness at one end of the trench than at another end of the trench. In an embodiment, the device further comprises a contact configured to apply a biasing voltage to the conductive material. In an embodiment, the trench extends through the semiconductor substrate.

In an embodiment, a system comprises: a plurality of means for sensing photons; means for electrically isolating the plurality of means for sensing photons; means for conducting positioned on the means for electrically isolating the plurality of means for sensing photons; and means for optically isolating the plurality of means for sensing photons enclosed by the means for conducting. In an embodiment, the system further comprises means for processing information generated by the plurality of means for sensing photons. In an embodiment, the means for optically isolating the plurality of means for sensing photons comprises a gas enclosed by the means for conducting.

BRIEF DESCRIPTION OF THE SEVERAL VIEWS OF THE DRAWINGS

Example embodiments will now be described in connection with, but not limited to, the appended drawings in which.

DETAILED DESCRIPTION

Figure 1:
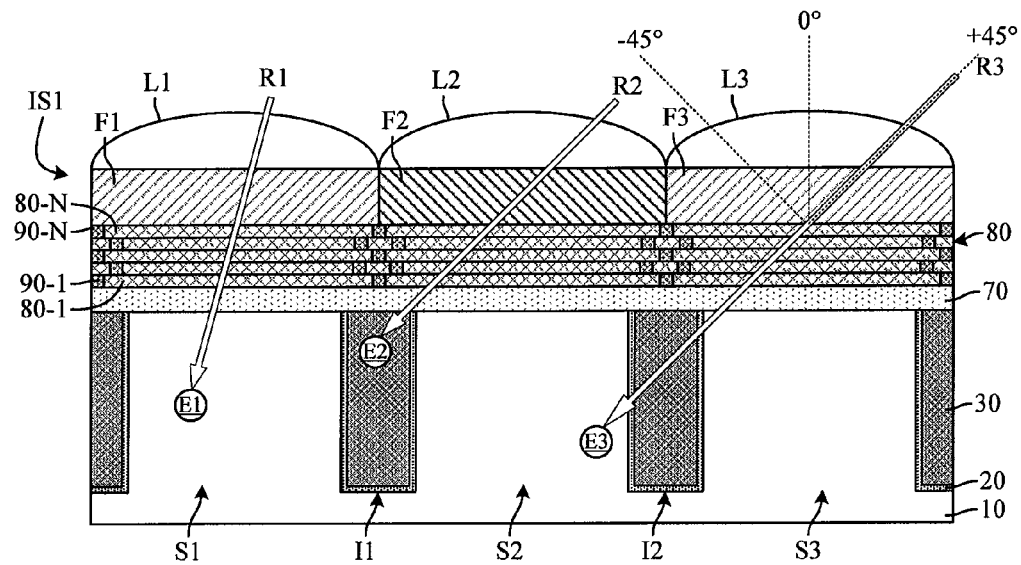
FIG. 1, previously described, is a cross-sectional view of a conventional image sensor comprising photosites separated by isolation regions.

In the following description, certain details are set forth in order to provide a thorough understanding of various embodiments of devices, methods and articles. However, one of skill in the art will understand that other embodiments may be practiced without these details. In other instances, well-known structures and methods associated with, for example, image sensors, semiconductor fabrication processes, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles may not be drawn to scale, and some of these elements may be enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a reference to square-shaped does not mean that an element has a geometrically perfect square shape.

FIGS. 2A to 2G are cross-sectional views schematically showing different steps of fabricating an image sensor IS2 according to an embodiment.

Figure 2A:
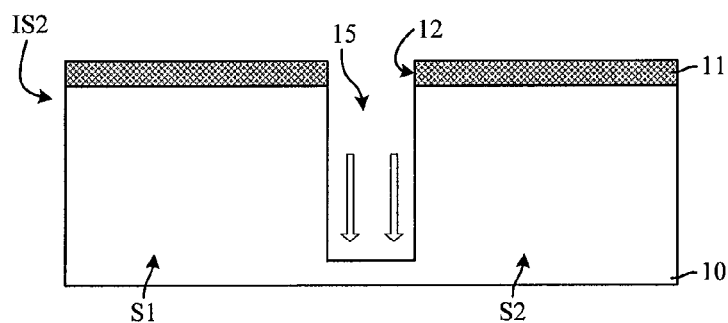
FIGS. 2A to 2G show steps of a process of fabricating an image sensor according to a first embodiment.

In FIG. 2A, the image sensor 152 includes a substrate 10 covered by a mask layer 11. The mask layer may be a "hard mask" that has been etched according to a patterned resist layer (not shown). The substrate 10 includes photosites S1, S2 fabricated during precedent processing steps. Despite that only two photosites are shown, the substrate generally includes a matrix of photosites. Additional elements, such as the details of the photosites, are not shown for the sake of simplicity.

An opening 12 has been made in the mask layer 11, between the photosites S1, S2. The patterning of the opening has been done for example by means of conventional photolithography steps of exposure, development, and etching. A trench 15 is then etched in the substrate 10 in the region underlying the opening 12. The trench 15 is, for example, a deep trench isolation, with a depth of at least 4 μm. A reactive ion etch ("RIE") process may be used with an anisotropic etch reagent, to obtain a trench with sidewalls substantially vertical. The trench 15 generally extends along the entire matrix of photosites, and other similar trenches may be made at right angles or parallel to trench 15, so that each photosite is completely surrounded by trenches.

Figure 2B:
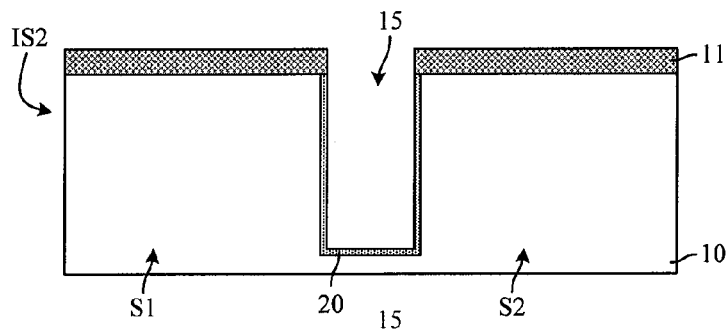

During steps shown in FIG. 2B, a thin liner 20 is formed on the sidewalls and the bottom of the trench 15 using, for example, a conformal process, so that its thickness is substantially uniform. The liner 20 may be silicon dioxide SiO2, nitric oxide NO, silicon oxide SiO, a high density plasma (HDP) oxide, a spin on dielectric (SOD), or other suitable material, and may be thermally grown or deposited. The liner may have a thickness of approximately 10 nm.

Figure 2C:
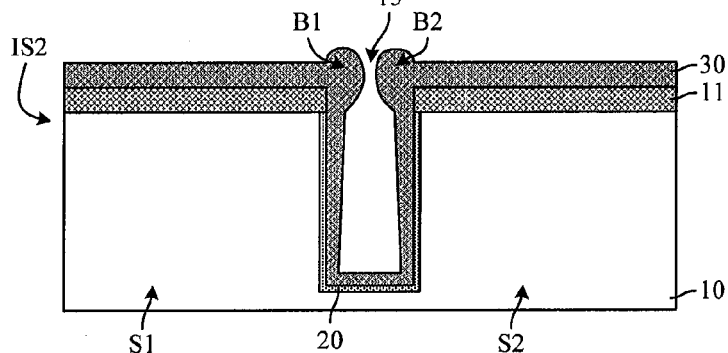

During steps shown in FIG. 2C, a non-conformal deposition process may be used to deposit a conductive material 30 in the trench 15. The conductive material has a first refractive index, such as 3.5, and may be polysilicon. The conductive material may be a highly doped N or P type material containing silicon, silicon-germanium, or a conductive material containing silicon that is then doped.

As it can be seen in FIG. 2C, the conductive material 30 is deposited on the sidewalls of the trench with an increasing thickness from the bottom to the upper portion of the sidewalls, and bumps B1, B2 of the conductive material form at the top edges of the trench 15. As the deposition process progresses, the bumps B1, B2 get larger, as well as the thicknesses of the conductive material 30 on the upper portions of the sidewalls of the trench 15. This non-conformal deposition process may be a plasma-enhanced chemical vapor deposition ("PECVD") process, wherein the atoms have the tendency to gather at the top edges of the trench, and to not gather at the bottom of the trench.

Figure 2D:
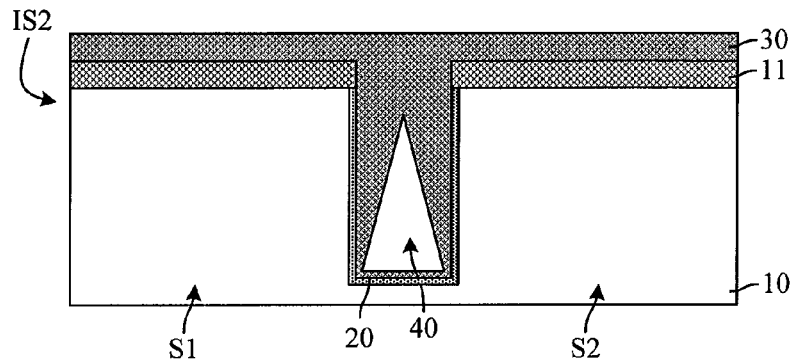

In FIG. 2D, the non-conformal deposition process has been continued until the bumps B1, B2 of the conductive material 30 have merged together such that the conductive material 30 delimits and surrounds a region 40, which is enclosed in this embodiment. The region 40 contains a gas gap with a second refractive index, lower than the first refractive index, here an air gap having a refractive index of 1. The region 40 may also be filled with a material having a refractive index lower than first refractive index.

Figure 2E:
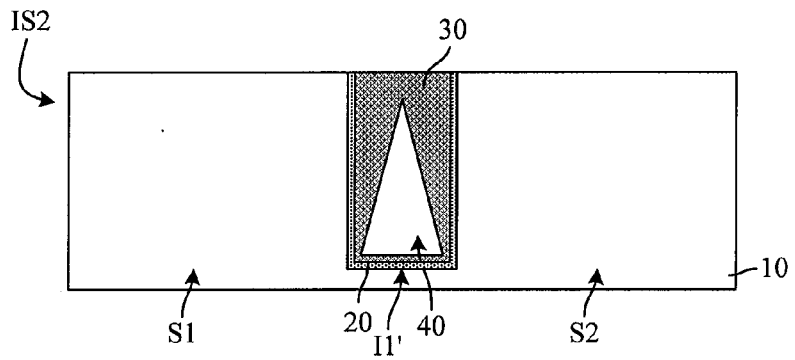

During steps shown in FIG. 2E, the conductive material 30 extending beyond the top surface of the image sensor IS2 and the mask layer 11 are removed down to the substrate 10. This may be done in one or more steps, for example a first step of chemical-mechanical polishing ("CMP") of the conductive material, followed by a wet etch of the mask layer 11. The trench 15 thus includes the liner 20 on its bottom and sidewalls, covered by the conductive material 30 surrounding region 40. The trench 15, liner 20, conductive material 30, and region 40 form an isolation region I1' between photosites S1, S2.

Figure 2F:
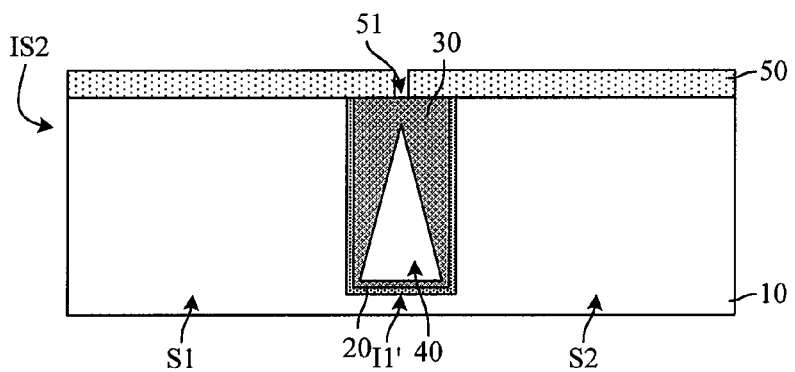

During steps shown in FIG. 2F, a pre-metal dielectric ("PMD") material layer 50 is deposited above the top surface of the image sensor IS2. A hole 55 is then formed in the layer 50, above the isolation region I1'. The hole 55 may be formed by etching after a photolithographic patterning step.

Figure 2G:
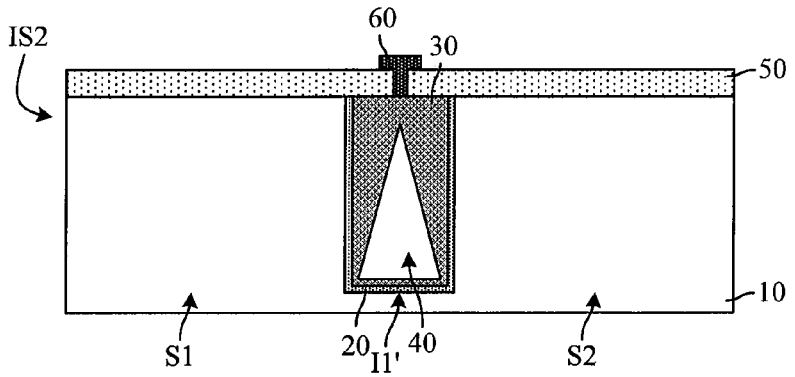

During a step shown in FIG. 2G, an electrical contact 60 is formed in the hole 55 in contact with the conductive material 30 in the isolation region I1'. During the use of the sensor, it may be possible to use the contact 60 to bias the conductive material 30 positive or negative, depending upon the type of photosite, and the amount of biasing may be adjusted to create an accumulation region near the sidewalls of the isolation region I1'. In this manner, surface states at the interface between the substrate 10 and the thin liner 20 may be passivated.

After the contact 60 has been made, the image sensor IS2 undergoes further processing steps, such as forming a stack of dielectric layers on the image sensor surface, forming conductive lines in the dielectric layers, and then forming colored filters and microlenses above the stack of dielectric layers.

Figure 3:
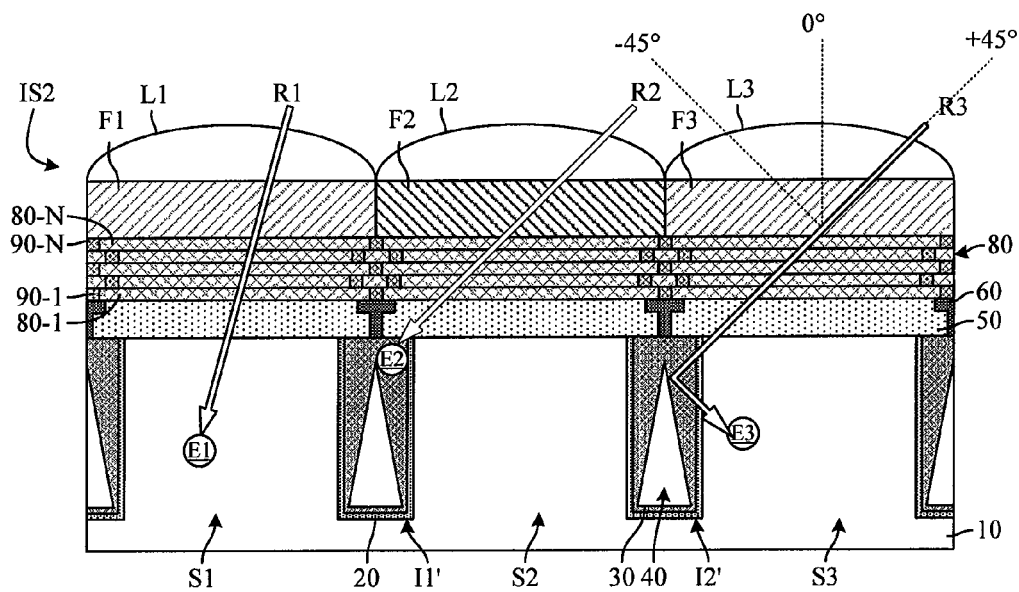
FIG. 3 shows an image sensor fabricated according to the first embodiment.

FIG. 3 is a cross-sectional view of a part of the image sensor IS2 fabricated with the above-described method. The image sensor IS2 includes, from bottom to top, the substrate 10, three photosites S1, S2, S3 embedded in the substrate, the pre-metal dielectric layer 50 comprising contacts 60, a stack 80 of dielectric layers 80-1 to 80-N, conductive lines 90-1 to 90-N embedded in the dielectric layers, filters F1, F2, F3, and microlenses L1, L2, L3 above the stack 80. Isolation regions I1', I2' made according to the above-described process extend between sites S1, S2 and S2, S3 respectively, and each includes a deep trench having its bottom and sidewalls covered by the thin liner 20 and filled with the conductive material 30 delimiting and surrounding the region 40.

One of the conductive lines, for example line 90-1, is in electrical contact with contact 60 to apply an electrical voltage to the conductive material 30 of the isolation regions I1', I2' in order to passivate the surface states near the sidewalls of the trench 15. The biasing of the sidewalls using contact 60 facilitates any electrons generated near the interface between the substrate 10 and the liner 20 to be returned to the photosite due to the electric field produced, instead of being trapped by the surface states at this interface.

The isolation regions I1', I2' reduce optical crosstalk thanks to the optical waveguide formed by the differences between refractive indices at the interfaces between the substrate 10, the conductive material 30, and the region 40. The liner 20 is generally too thin to influence the optical properties of the isolation regions. By selecting the materials, and thus their refractive indices, total internal reflection may occur when a ray of light strikes an interface between two materials at an angle smaller than a critical angle, the angle of incidence below which the total internal reflection occurs. Depending on the thickness of and the refractive index of the material on the other side of the interface, no light passes through and it is entirely reflected.

FIG. 3 also shows three light rays having the same incident angles as those shown in FIG. 1. Light ray R1 passes through filter F1, penetrates into photosite S1, and generates an electron E1 read by photosite S1. Light ray R2 passes through filter F2 and has an angle and a penetration depth such that it enters the isolation region I1' instead of a photosite. The photons of ray R2 are absorbed in the conductive material 30 of the isolation region I1', and generate a trapped electron E2. The presence of region 40 reduces the amount of conductive material 30 in the isolation regions I1', I2', thereby reducing the probability of a photon being absorbed and trapped in the isolation regions. Quantum efficiency is thus improved.

Light ray R3 passes through filter F3, and has an angle such that instead of being absorbed in the corresponding photosite S3, it enters the isolation region I2'. It is reflected off the interface between the conductive material 30 and the region 40 in isolation region I2', and returns to photosite S3 where it generates an electron E3, thereby preventing optical crosstalk. Moreover, the angular response is improved, since a larger field of view is obtained. As can be seen at photosite S3, the light ray R3 has an angle of for example 45° (depending upon the materials used, the thickness of the dielectric stack 80, etc.), but due to the isolation region I2', it is reflected back into the site S3, rather than passing to site S2 as in FIG. 1. Therefore, statistically, the structure of the isolation regions I1', I2' allow for a reduction of optical crosstalk.

Figure 4:
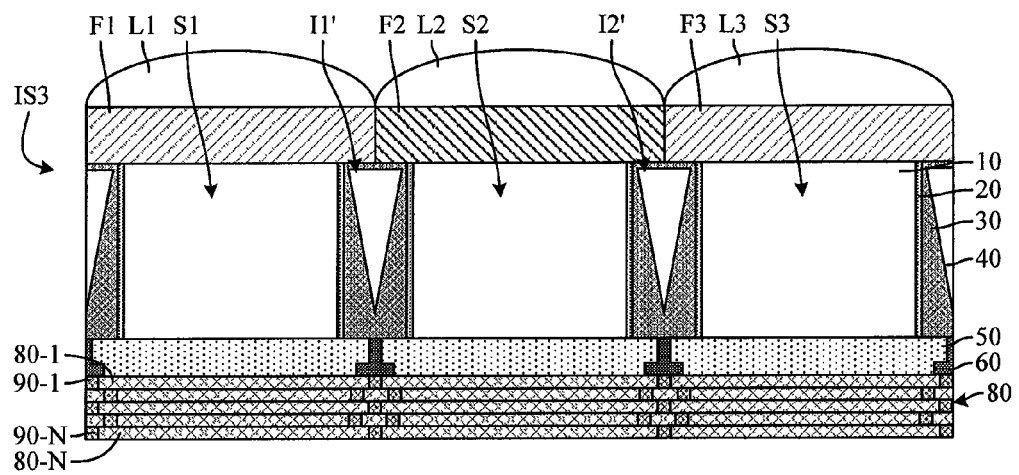
FIG. 4 shows an image sensor fabricated according to a second embodiment.

FIG. 4 shows a cross-sectional view of a second embodiment of an image sensor. Image sensor 183 is essentially the same as image sensor 182, differing in that the colored filters F1, F2, F3 and the microlenses L1, L2, L3 are arranged on the "backside" of the substrate, which is then turned around to face the incident light. It may also be seen that the liner 20 is only present on the sidewalls of the isolation regions, as the trench extends entirely through the substrate 10.

In this manner, the stack 80 of dielectric layers and the metal interconnections 90 do not block or deflect light from reaching the photosites, which can significantly increase sensitivity of the image sensor, in particular for smaller and smaller photosite sizes. This architecture allows for improved angular dependency, as there is no narrow channel between metal interconnects as with conventional front side illuminated image sensors, and the efficiency does not depend on the design and thickness of the metal interconnects and dielectric stack.

After certain processing steps are completed, such as the steps shown in FIG. 2G, the substrate 10 may be "thinned" to approximately 2-20 µm, depending upon the application. If the substrate is too thick, the photons will be absorbed in the substrate too far away from the photosites, increasing electrical crosstalk. On the contrary, if the substrate is too thin, longer wavelengths will pass right through the substrate and not be absorbed, decreasing quantum efficiency. After thinning, the color filters F1, F2, F3 and microlenses L1, L2, L3 are deposited on the backside of the substrate. An anti-reflective coating may be deposited between the substrate and color filters to reduce reflections.

Figure 5:
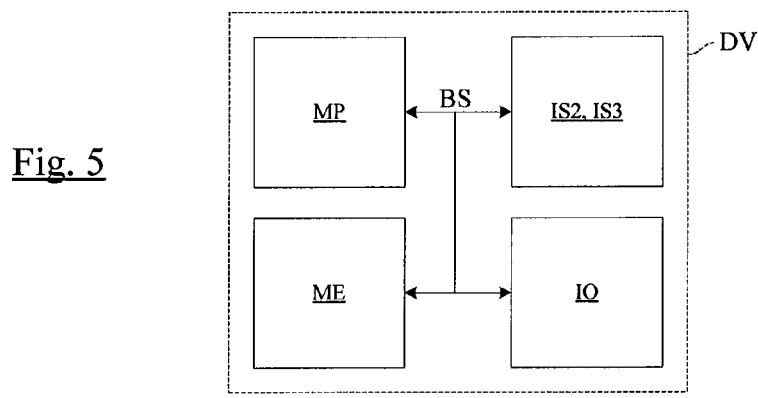
FIG. 5 shows a device comprising an image sensor according to an embodiment.

An embodiment relates to a device DV comprising an image sensor, as shown in FIG. 5. The device DV includes an image sensor IS2, IS3, a microprocessor MP, a memory MEM, and an input/output IO. These elements are interconnected by a bus BS. Such a device may be a camera, machine vision, mobile telephone camera, surveillance system, image stabilization system, motion detector, etc.

It will be understood that the method described above in relation to FIGS. 2A to 2G is susceptible of different embodiments. For example, the photosites may be formed in the substrate after the isolation regions I1', I2' have been formed, such as after the steps shown in FIG. 2E. Furthermore, other materials may be used for the substrate 10, liner 20, conductive material 30, and region 40.

It will also be understood that the region 40 may comprise a material or gas other than air. In particular, another gas may be injected into the enclosed region, such as right before it is enclosed during the deposition process or by for example making a small hole through the conductive material that is then plugged.

In other embodiments, the liner 20 is not deposited or formed on the bottom of the trench 15. It may be deposited on the bottom and then removed, such as during a thinning process, or may be deposited only on the sidewalls, such as by using a deposition mask on the bottom of the trench that is removed after the deposition of the liner 20.

In other embodiments, the region 40 having the second refractive index may not be completely enclosed by the conductive material 30. It may first be formed as an enclosed region and the substrate may then be thinned to such a point that region 40 is reached and opened.

In other embodiments, the photosites are not completely surrounded by the isolation regions. For example, only photosites corresponding to a certain filter color may be surrounded by isolation regions, or the isolation regions may only be present in one direction.

In other embodiments, the conductive material 30 may be deposited in the trench 15 using a conformal or non-conformal process, without enclosing the top of the trench. A thin film may then be deposited over the top of the trench, enclosing the region 40 with the second refractive index. The pre-metal dielectric layer 50 may then be deposited thereabove without entering into the region 40.

While the methods described herein provide certain example steps of, for example, making an image sensor, embodiments of devices are not limited to devices made using the particular example steps described herein.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, state machines, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
fabricating an image sensor by,
forming two photosites in a semiconductor substrate;
forming a trench between the photosites;
forming a dielectric liner on one or more sidewalls of the trench; and
positioning a conductive material having a first refractive index on the dielectric liner in the trench, the conductive material enclosing a region having a second refractive index lower than the first index of refraction.

2. The method according to claim 1 wherein the positioning the conductive material in the trench comprises depositing the conductive material on the dielectric liner of the trench until the region is enclosed in the conductive material.

3. The method according to claim 1 wherein the positioning the conductive material in the trench comprises enclosing a gas having the second refractive index in the enclosed region.

4. The method according to claim 1 wherein the positioning the conductive material in the trench comprises using a non-conformal deposition process of the conductive material.

5. The method according to claim 1 wherein the positioning the conductive material in the trench comprises depositing the conductive material so that a thickness of the conductive material on the liner is greater at a first portion of the trench, and thinner at a second portion of the trench.

6. The method according to claim 1 wherein the positioning the conductive material comprises depositing the conductive material using a plasma-enhanced chemical vapor deposition process.

7. The method according to claim 1, further comprising a step of forming a contact electrically coupled to the conductive material.

8. The method of claim 1 wherein forming the trench comprises forming a trench extending through the semiconductor substrate.

9. An image sensor, comprising:
a semiconductor substrate;
at least two photosites positioned in the substrate; and
an isolation region positioned between the photosites, the isolation region having:
a trench having one or more sidewalls;
a dielectric liner positioned on the one or more sidewalls of the trench;
a conductive region having a first refractive index and positioned on the dielectric liner; and
a region having a second refractive index lower than the first refractive index and enclosed by the conductive region.

10. The image sensor according to claim 9 wherein the enclosed region having the second refractive index comprises a gas.

11. The image sensor according to 9 wherein the conductive material positioned on the one or more sidewalls of the trench has a greater thickness at one end of the trench than at another end of the trench.

12. The image sensor according to claim 9 wherein the first refractive index is greater than 3, and the second refractive index is less than 1.5.

13. The image sensor according to claim 9, further comprising a contact configured to apply a biasing voltage to the conductive material.

14. The image sensor according to claim 9, further comprising a plurality of filters and a plurality of microlens coupled to respective photosites.

15. The image sensor of claim 9 wherein the trench extends through the semiconductor substrate.

16. A device, comprising:
a processor; and
an image sensor, the image sensor including:
a semiconductor substrate;
at least two photosites positioned in the substrate; and
an isolation region positioned between the photosites, the isolation region having:
a trench having one or more sidewalls;
a dielectric liner positioned on the one or more sidewalls of the trench;
a conductive region having a first refractive index and positioned on the dielectric liner; and
a region having a second refractive index lower than the first refractive index and enclosed by the conductive region.

17. The device of claim 16 wherein the enclosed region having the second refractive index comprises a gas.

18. The device of claim 16 wherein the conductive material positioned on the one or more sidewalls of the trench has a greater thickness at one end of the trench than at another end of the trench.

19. The device of claim 16, further comprising a contact configured to apply a biasing voltage to the conductive material.

20. The device of claim 16 wherein the trench extends through the semiconductor substrate.

21. A system, comprising:
a plurality of means for sensing photons;
means for electrically isolating the plurality of means for sensing photons;
means for conducting positioned on the means for electrically isolating the plurality of means for sensing photons; and means for optically isolating the plurality of means for sensing photons enclosed by the means for conducting.

22. The system of claim 21, further comprising means for processing information generated by the plurality of means for sensing photons.

23. The system of claim 20 wherein the means for optically isolating the plurality of means for sensing photons comprises a gas enclosed by the means for conducting.

* * * * *